United States Patent [19]

Nakase

[11] Patent Number: 5,428,302
[45] Date of Patent: Jun. 27, 1995

[54] LOGIC CIRCUIT WITH CONTROLLED CURRENT SUPPLY OUTPUT

[75] Inventor: Yasunobu Nakase, Itami, Japan

[73] Assignee: Mitsubishi Denki Kabushiki Kaisha, Tokyo, Japan

[21] Appl. No.: 52,200

[22] Filed: Apr. 22, 1993

[30] Foreign Application Priority Data

Apr. 23, 1992 [JP] Japan ................................ 4-104254

[51] Int. Cl.⁶ .......................................... H03K 19/01
[52] U.S. Cl. ......................................... 326/17; 326/85
[58] Field of Search ............... 307/443, 446, 455, 475, 307/570

[56] References Cited

U.S. PATENT DOCUMENTS

| | | | |
|---|---|---|---|
| 4,999,519 | 3/1991 | Kitsukawa et al. | 307/446 |
| 5,015,880 | 5/1991 | Drake et al. | 307/443 |
| 5,017,812 | 5/1991 | Wu | 307/446 X |
| 5,086,240 | 2/1992 | Neu | 307/446 X |
| 5,278,465 | 1/1994 | Hamada | 307/455 X |

OTHER PUBLICATIONS

Multi-Emitter BiCMOS Logic circuit family, by G. Boudon, et al. 1990 Symposium on VLSI Circuits pp. 665-669. Jun. 1990.

*Primary Examiner*—David R. Hudspeth
*Attorney, Agent, or Firm*—Herbert F. Ruschmann; Christopher R. Pastel; Thomas R. Morrison

[57] ABSTRACT

A semiconductor logic circuit apparatus includes a plurality of logic circuits each including complementary field effect transistors, and a plurality bipolar transistors associated with the respective ones of the logic circuits. When any one of the outputs of the logic circuits becomes high, an associated bipolar transistor becomes conductive to cause an output terminal of the apparatus to be charged from a voltage supply. With all the outputs of the logic circuits being low, all of the bipolar transistors are non-conductive, and a current supply coupled between the output terminal and ground dicharges charge on the output terminal.

16 Claims, 13 Drawing Sheets

LOGIC CIRCUIT WITH CONTROLLED CURRENT SUPPLY OUTPUT

This invention relates to an improvement on a logic circuit apparatus which comprises complementary field effect transistors (hereinafter referred to as CMOSFET's) and bipolar transistors.

BACKGROUND OF THE INVENTION

An example of conventional logic circuits comprising CMOS's is shown in FIG. 1. This circuit is four-input NAND circuit.

This logic circuit includes P-type MOS field effect transistors (hereinafter referred to as PMOSFET's) 81, 82, 83 and 84 having their source-drain conduction paths connected in parallel between an output terminal 89 of the circuit and a voltage supply VDD. The gates of these PMOSFET's 81–84 receive input signals A, B, C, and D, respectively. Between the output terminal 89 and a ground line, the drain-source conduction paths of N-type MOS field effect transistors (hereinafter referred to as NMOSFET's) 85, 86, 87 and 88 are connected in series. The gates of these NMOSFET's 85–88 also receive the input signals A, B, C, and D, respectively. The input signals A, B, C, and D assume either a higher potential (e.g. VDD) or a lower potential (e.g. ground potential).

In FIG. 1, when at least one of the input signals A, B, C, and D is at the lower potential, at least one of PMOSFET's 81–84 is conductive and, therefore, the output terminal 89 receives current from the voltage supply VDD. At the same time, at least one of the NMOSFET's 85–88 is non-conductive, and, therefore, no current will flow from the output terminal 89 to the ground line. Thus, the output terminal 89 is charged through at least one of the PMOSFET's so that its potential rises. If all of the input signals A, B, C, and D are at the high potential, all of the PMOSFET's 81–84 are non-conductive, whereas all of the NMOSFET's 85–88 are conductive. Accordingly charge stored at the output terminal 89 is discharged through the NMOSFET's 85–88 to the ground line and its potential decreases. In other words, the output of this four-input NAND circuit is expressed as $(\overline{A \cdot B \cdot C \cdot D})$.

An example of conventional four-input NAND circuit comprising a combination of CMOSFET's and bipolar transistors is shown in FIG. 2. This circuit was disclosed at 1990 Symposium on VLSI Circuits held in Honolulu, Jun. 7–9, 1990 by G. Boudon et al. (see pages 87–88 of Digest of Technical Papers). Different from the circuit shown in FIG. 1, this circuit includes NPN bipolar transistors 95, 96, 97 and 98 having their collector-emitter conduction paths connected in parallel with each other between an output terminal 9K and a voltage supply VDD. More specifically, the collectors of the transistors 95–98 are connected to the voltage supply VDD and the emitters are connected to the output terminal 9K. The bases of the bipolar transistors 95–98 receive input signals A, B, C and D after they are inverted by CMOS inverters 91, 92, 93 and 94, respectively. An NPN bipolar transistor 9J has its collector connected to the output terminal 9K and has its emitter connected to a grounded line. Source-drain conduction paths of NMOSFET's 99, 9E, 9F and 9G are connected in series between the output terminal 9K and the base of the transistor 9J. The gates of the NMOSFET's 99, 9E, 9F and 9G receive the input signals A, B, C and D, respectively. Between the base of the transistor 9J and ground, the source-drain conduction path of an NMOSFET 9H is connected. The gate of the NMOSFET 9H receives a voltage developed at the output terminal 9K.

In FIG. 2, when at least one of the input signals A, C, and D is at the low potential, at least one of the inverters 91–94 develops an output at the high potential so that a base current is supplied to the bipolar transistor connected to that inverter to render that bipolar transistor conductive. Then the output terminal 9K is charged through the now conducting bipolar transistor from the voltage supply VDD so that its potential rises. When all of the input signals A, B, C, and D are at the high voltage, the outputs of all of the inverters 91–94 are at the low potential. This causes all of the bipolar transistors 95–98 to become non-conductive, while all of the NMOSFET's 99–9G are rendered conductive to provide a base current to the bipolar transistor 9J. This, in turn, causes the bipolar transistor 9J to become conductive so as to discharge the output terminal 9K through the transistors 9J, and, therefore, the potential at the output terminal 9K decreases. In other words, the output of the four-input NAND circuit shown in FIG. 2, similar to the four-input NAND circuit of FIG. 1, is expressed as $(\overline{A \cdot B \cdot C \cdot D})$. The NMOSFET 9H is connected between the base of the bipolar transistor 9J and ground for the following reason. When the output terminal 9K changes from the low potential to the high potential, it is necessary to make the conducting bipolar transistor 9J non-conductive rapidly. If it takes a long time for the bipolar transistor 9J to change to the non-conductive state, current to charge the output terminal 9K would flow through the bipolar transistor 9J to ground, which increases consumed current and also time necessary for the output terminal 9K to changed from low to high potentials. In order to prevent this from occurring, when the output terminal 9K changes from the low potential to the high potential, such change is used to render the NMOSFET 9H conductive to draw charge stored on the base of the transistor 9J into ground so that the bipolar transistor 9J can rapidly turned off.

In the NAND circuit arrangement shown in FIG. 1, for an increased number of input signals, the number of NMOSFET's to be connected between the output terminal 89 and ground must be increased. The particular circuit shown in FIG. 1, because the number of input lines is four, the number of the NMSOFET's is four. However, if the number of input lines is increased to, for example, eight, the number of the NMOSFET's must be also doubled to eight. Increase in number of serially connected NMOSFET's means increase in the equivalent resistance between the output terminal 89 and ground exhibited when all of these NMOSFET's become conductive. (This equivalent resistance is equal to the sum of the ON-resistances of all of the NMOSFET's.)

The increase of the equivalent resistance causes current flowing from the output terminal 89 to ground to decrease. Consequently, as the number of input signals to the NAND circuit of FIG. 1 increases, the speed at which the output terminal 89 changes from its high potential to the low potential decreases. It may be possible to improve the changing speed by reducing the ON-resistances of the respective NMOSFET's. It, however, requires to increase the size of each of the NMOSFET's, which could be accompanied by increase of the input capacitance. This means increase of load to the stage preceding the NAND circuit which drives the NAND circuit.

Another problem exists. When, for example, the output of the NAND circuit of FIG. 1 is used as a common input to a number of logic circuits, the load capacitance on the output terminal 89 increases so that the time for charging and discharging the output terminal 89 increases. In order to avoid it, the size of each MOSFET may be increased to make use a larger drive current. However, as aforementioned, this increases the input capacitance of this NAND circuit, which means that the load on the preceding circuit increases. In place of increasing the sizes of the MOS transistors, the arrangement shown in FIG. 2 employs bipolar transistors to increase a drive current. In the arrangement shown in FIG. 2, the bipolar transistors 95, 96, 97 and 98 are driven by being supplied with their respective base currents from the CMOS inverters 91, 92, 93 and 94, respectively, and the bipolar transistor 9J is driven by being supplied with its base current from the NMOSFET's 99, 9E, 9F and 9G. Accordingly, the output terminal 9K is charged and discharged by a current flowing through a currently conducting MOS amplified by the bipolar transistor by its current amplification factor. This current amplification factor is on the order of 100, and, therefore, even when the output load capacitance is large, the output potential can rapidly rise or fall.

Although the arrangement of FIG. 2 has an advantage that even when the load capacitance at the output terminal 9K is large, the terminal 9K can be rapidly charged or discharged, it had a disadvantage that the number of constituent components increases. Specifically, in comparison with the CMOS circuit of FIG. 1, the number of NMOSFET's is doubled from 4 to 8. This increases a corresponding increase of not only the area occupied by the NMOSFET's but also input capacitance. Furthermore, since the NMOSFET's 99, 9E, 9F and 9G which drive the bipolar transistor 9J are connected in series, the same problem of degradation of the output potential rising and fall characteristic as in the arrangement of FIG. 1 is still present.

The above-described problems are solved by the present invention. According to the present invention, a logic circuit is provided, which has a time of transition from a high potential to a low potential that is less dependent on the number of input signals, and which can comprise a small number of circuit components.

SUMMARY OF THE INVENTION

A semiconductor logic circuit apparatus according to the present invention includes a plurality of logic circuits each comprising complementary field effect transistors, a plurality of bipolar transistors having their bases connected to the respective outputs of the logic circuits and having their collectors connected to a voltage supply, a common circuit node to which the emitters of the bipolar transistors are connected, and a current supply connected between the common circuit node and the ground potential.

A semiconductor logic circuit arrangement according to another feature of the present invention includes a plurality of common nodes, current supplies connected between the respective ones of the common nodes and the ground potential, a multiple-emitter bipolar transistor having its emitters connected to the respective ones of the common nodes, a common logic circuit comprising complementary field effect transistors having its output connected to the base of the multiple-emitter bipolar transistor, a plurality of bipolar transistors having their emitters connected to the respective ones of the common nodes and having their collectors connected to the respective current supplies, and complementary field effect transistor arrangements having their outputs connected to the bases of the respective bipolar transistors.

BRIEF DESCRIPTION OF THE DRAWINGS

FIG. 12b shows a circuit diagram of the NAND circuits used in the circuit of FIG. 12a;

FIG. 13b shows a circuit diagram of the NOR circuits used in the circuit of FIG. 13a.

DETAILED DESCRIPTION OF PREFERRED EMBODIMENTS

Embodiment 1

Figure 8:
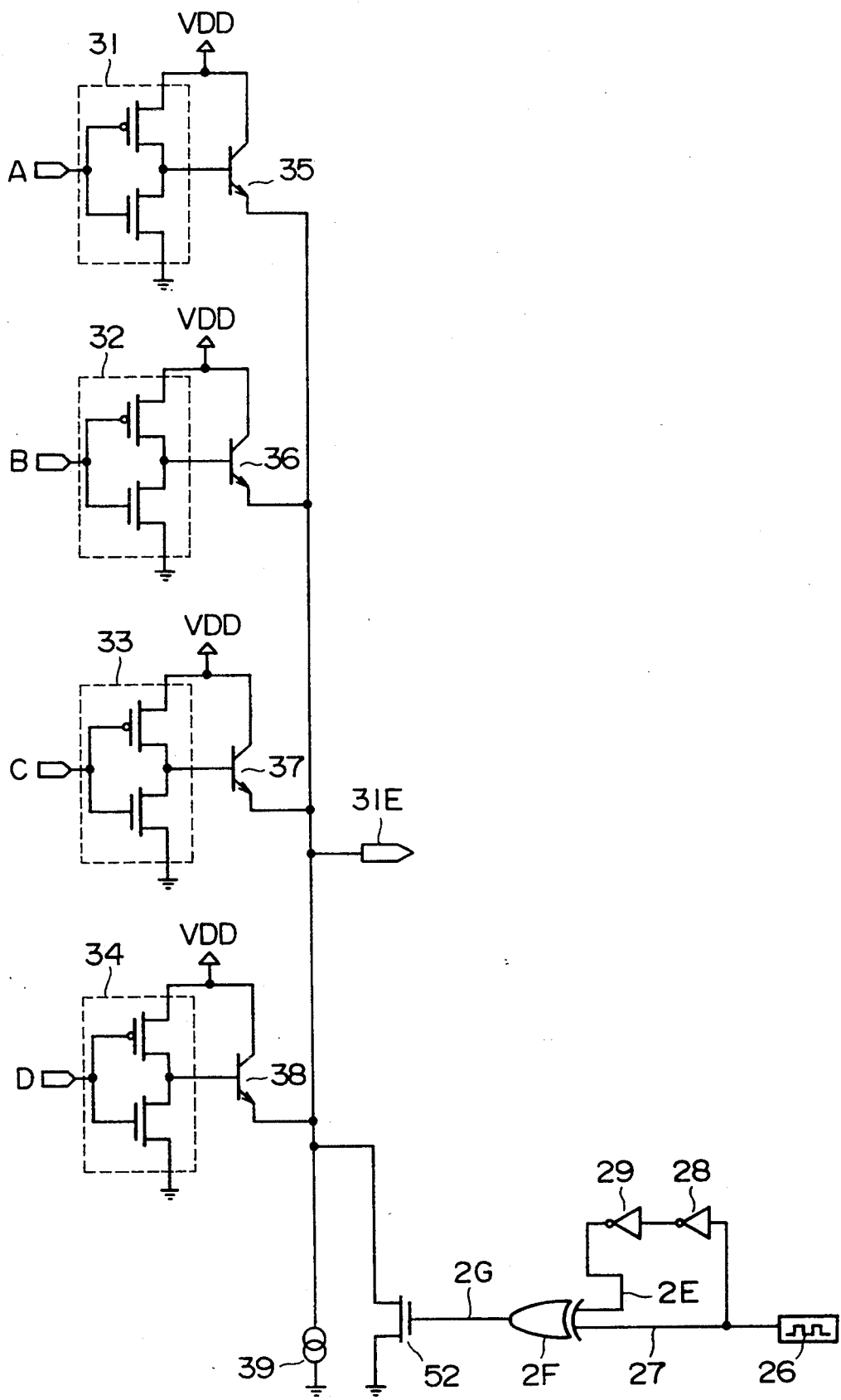
FIG. 8 shows a circuit arrangement according to a fourth embodiment of the present invention.

A logic circuit apparatus according to a first embodiment of the present invention is now described with reference to FIGS. 3 and 4(a), 4(b) and 4(c). The circuit shown in FIG. 8 is a four-input NAND circuit. Input signals A, B, C and D are applied to corresponding ones of CMOS inverters 1, 2, 3 and 4, respectively. Outputs of the inverters 1, 2, 8 and 4 are coupled to the bases of bipolar transistors 5, 6, 7 and 8, respectively. The emitters of the bipolar transistors are coupled to a common node 1E to form a so-called wired OR configuration. The common node 1E provides an output terminal of the circuit. A current supply 9 is connected between the output terminal and ground. The collectors of the bipolar transistors 5, 6, 7 and 8 are connected to a voltage supply VDD.

Any one of arrangements, such as shown in FIG. 4(a), 4(b) and 4(c) may be used for the current supply 9 of FIG. 8. The current supply shown in FIG. 4(a) includes an NMOSFET 2a which has its source grounded, has its drain connected to the output terminal 1E of FIG. 3, and has its gate supplied with a fixed potential, e.g. supply voltage VDD.

The current supply shown in FIG. 4(b) comprises a resistor 2b having its one end connected to the output terminal 1E and having the other end grounded.

The current supply shown in FIG. 4(c) also uses an NMOSFET 2c. This configuration is the same as the one shown in FIG. 4(a), except that the gate is connected to the drain. With the gate and the drain connected together, this NMOSFET 2c acts as an NMOS diode.

Figure 1:
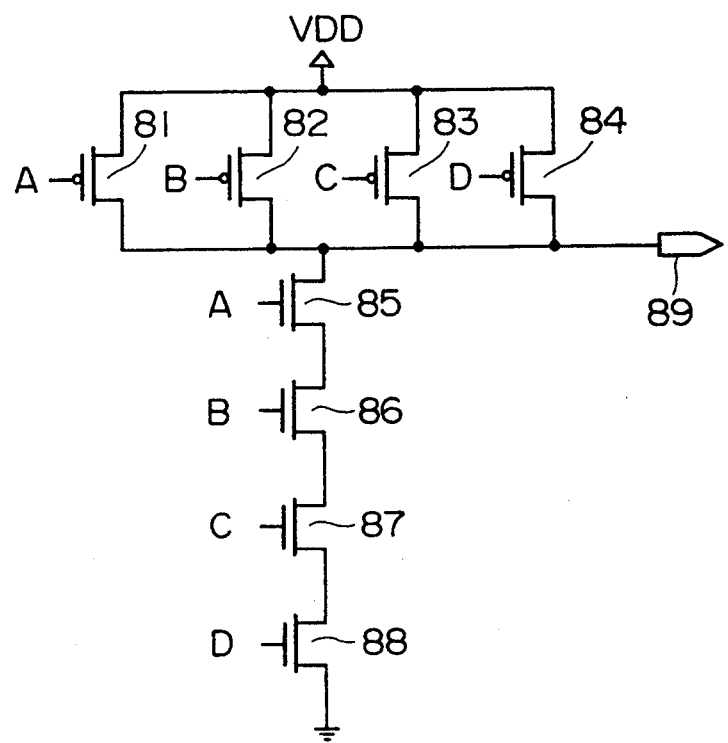
FIG. 1 shows a conventional four-input NAND circuit formed by CMOS's.
Figure 2:
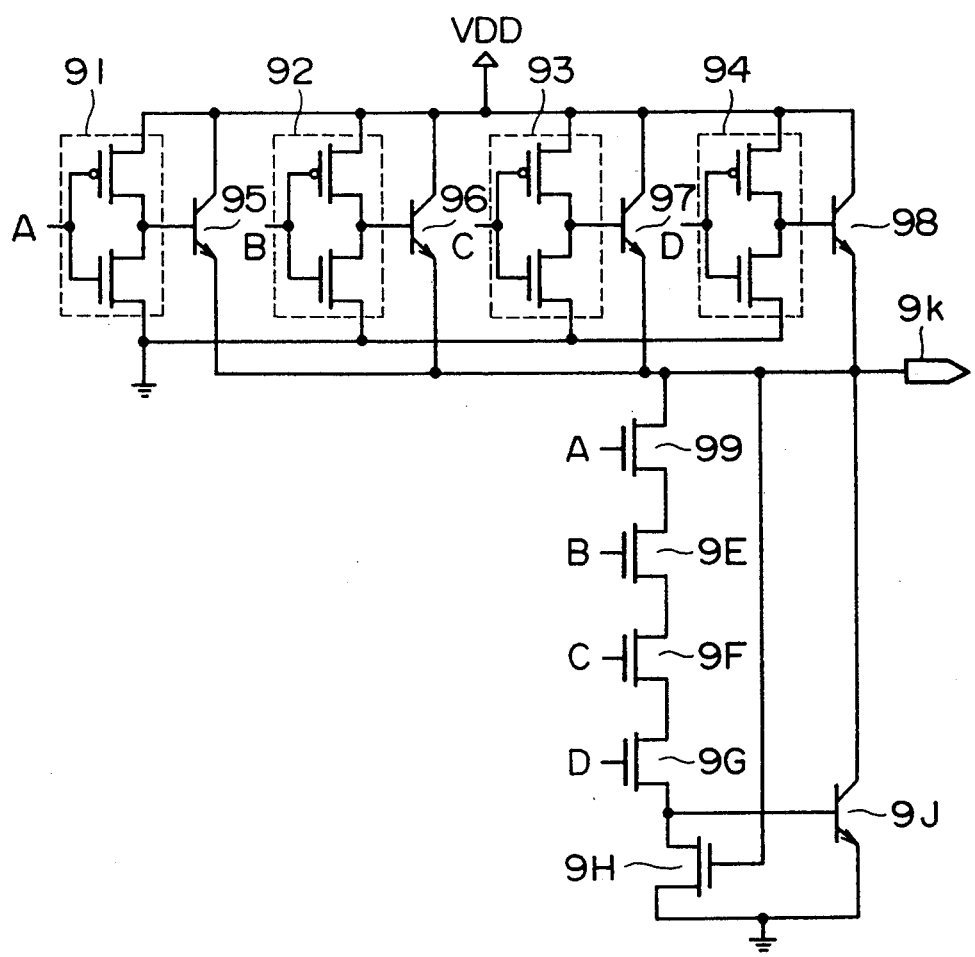
FIG. 2 shows another conventional four-input circuit comprising CMOS's and bipolar transistors.

In operation, as in the case of the conventional circuit shown in FIG. 2, when at least one of the input signals A, B, C, and D, e.g. A, is at a low potential, the output of one of the inverters 1–4, the inverter 1 in this case, becomes high to supply a base current to the bipolar transistor connected to it, the bipolar transistor 5 in this case. Then, the bipolar transistor 5 with its emitter grounded through the current supply 9 becomes conductive. Thus, the output terminal 1E is charged through the conducting bipolar transistor 5 from the voltage supply VDD so that the potential at the output terminal 1E rises to a high potential. The bipolar transistor 5 is arranged such that the current flowing therethrough is larger than the current flowing in the current supply 9. The output terminal 1E becomes low through the following operation. When all of the input signals A, B, C and D are at the high potential, all of the outputs of the inverters 1–4 become low and, therefore, all of the bipolar transistors 5–8 become non-conductive. Then, the output terminal 1E is discharged by the current supply 9 to a lower potential. In general, a logic provided by a plurality of bipolar transistors having their emitters connected to a common node is called wired OR, since the common node assumes the high potential when the base of at least one of the bipolar transistors is at the high potential. It should be noted, however, that the high potential at the common node is lower than the high potential applied to the base of a bipolar transistor by a base-emitter potential difference (=about 0.8 V). In the circuit arrangement shown in FIG. 3, the bipolar transistors 5–8 have their emitters connected to the output terminal 1E, thereby forming a wired OR circuit. Since the signals applied to the bases of the respective bipolar transistors 5–8 are the input signals A, B, C and D inverted by the respective inverters 1–4, the output developed at the output terminal 1E is $\overline{A}+\overline{B}+\overline{C}+\overline{D}=\overline{(A \cdot B \cdot C \cdot D)}$. Thus, this circuit is a NAND circuit.

Embodiment 2

Figure 3:
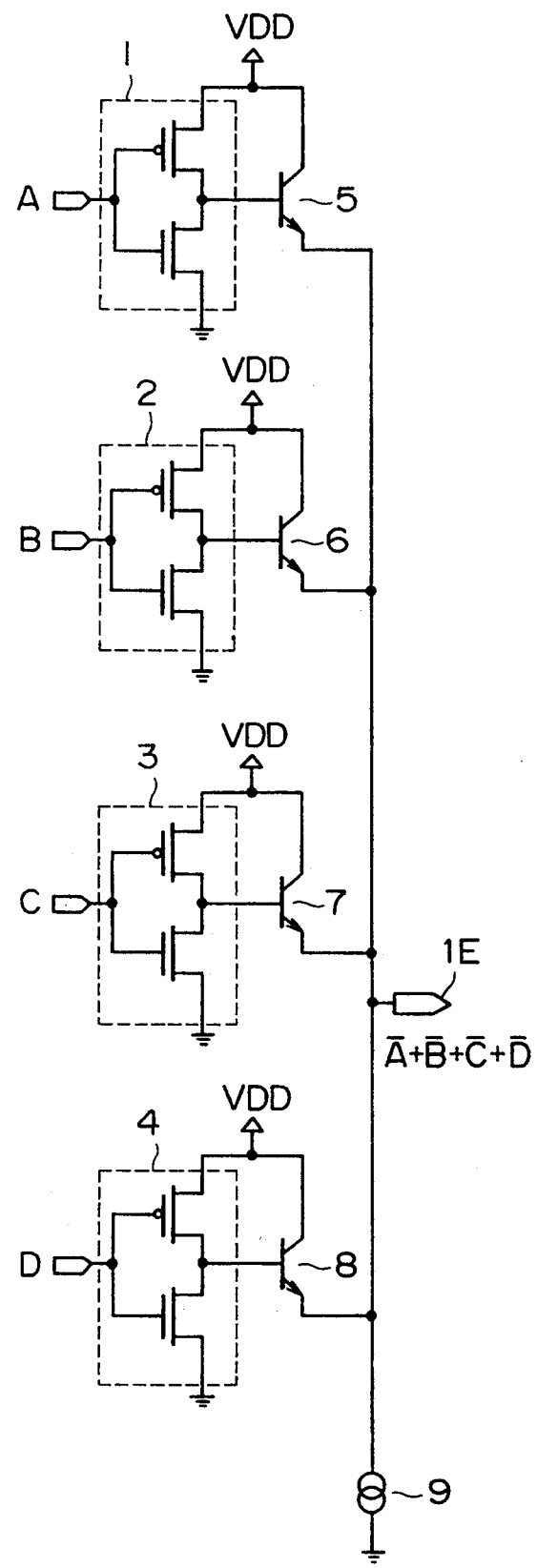
FIG. 3 shows a four-input NAND circuit according to a first embodiment of the present invention.
Figure 4:
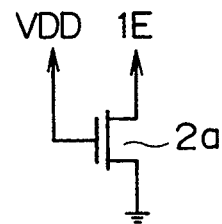
FIGS. 4(a), 4(b) and 4(c) shows various configurations of a current supply which can be used in the first embodiment shown in FIG. 3.
Figure 4:
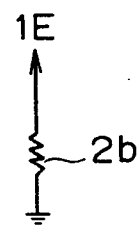
Figure 4:
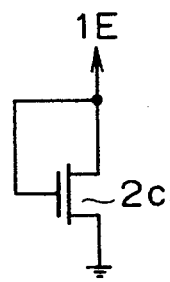

In the circuit shown in FIG. 3, any one of the configurations shown in FIGS. 4(a), 4(b) and 4(c) is used as the current supply 9. A longer time is required for the potential at the output terminal 1E to change from the high potential to the low potential when the parasitic capacitance at the output terminal 1E is large. In order to make such a time shorter as in the case of a smaller parasitic capacitance, the current value of the current supply 9 must be large. When the current supply 9 with the NMOSFET 2a or 2c shown in FIG. 4(a) or 4(c) is used, the transistor size must be made larger in order to increase the current value. In case that the current supply shown in FIG. 4(b) is used, the resistance of the resistor 2b must be made smaller. However, if such a current supply is used, a larger current will flow in the current supply 9 when the output terminal 1E is at the high potential, which disadvantageously leads to increase of consumed current. It is, therefore, desirable for reducing power consumption that a large current be supplied only when the output terminal 1E changes from the high potential to the low potential.

Figure 5:
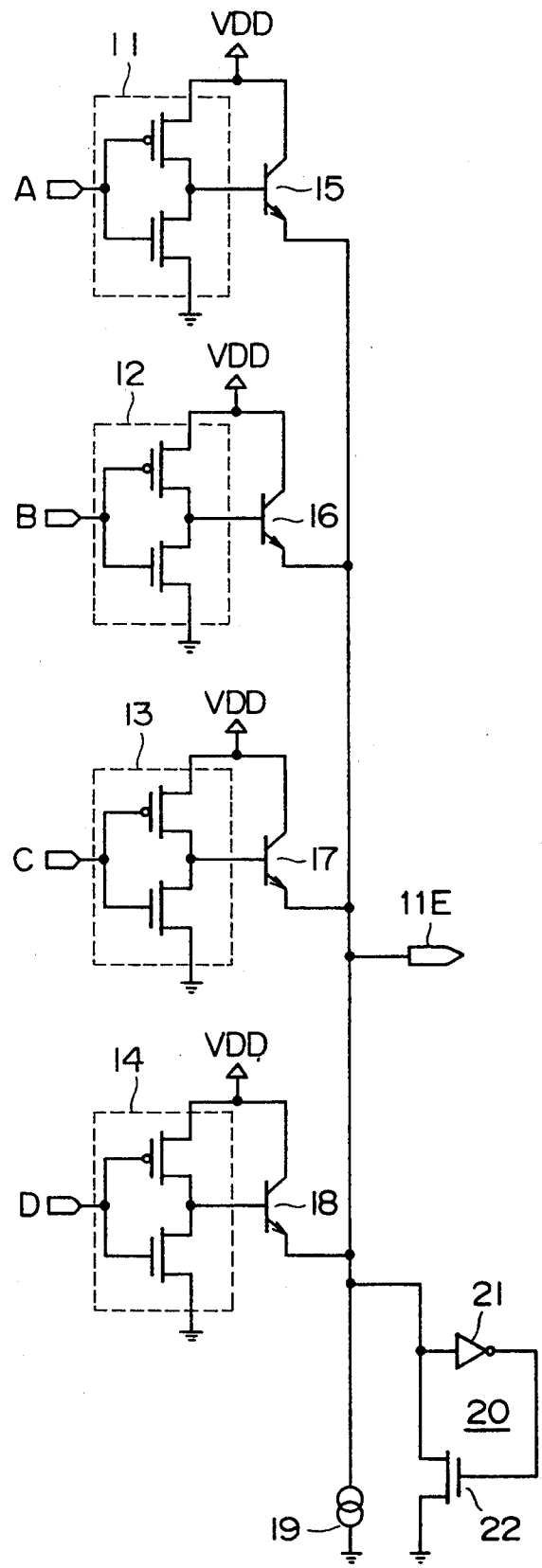
FIG. 5 shows a circuit according to a second embodiment of the present invention.

The four-input NAND circuit according to the second embodiment shown in FIG. 5 is arranged such that large current flows only when an output terminal 11E changes from a high potential to a low potential. What is different from the arrangement shown in FIG. 3 is that an additional current supply 20 is connected in parallel with a current supply 19 which is similar to the current supply of FIG. 3. (Components corresponding to those of FIG. 3 are denoted by reference numerals with "1" attached before the corresponding reference numerals of FIG. 3.) The current supply 20 comprises an NMOSFET 22 having its drain-source conduction path connected between the output terminal 11E and ground, and an inverter 21 having its input connected to the output terminal 11E and having its output connected to the gate of the NMOSFET 22. The current value of the current supply 20 is controlled by the potential at the output terminal 11E. More specifically, when the output terminal 11E changes from the high potential to the low potential, the current supply 19 first draws charge from the output terminal 11E. When the potential at the output terminal 11E becomes lower than the threshold value of the inverter 21, the output of the inverter 21 changes to the high potential to cause the NMOSFET 22 to become conductive. This causes current to flow from the output terminal 11E through the source-drain conduction path of the NMOSFET 22, which, then, draws charge from the output terminal 11E. Thus, the potential at the output terminal 11E changes from high to low potential rapidly. As the output terminal 11E is placed to the low potential, the potential difference between the ends of the source-drain conduction path becomes zero and no current flows through the source-drain conduction path. Thus, in the circuit arrangement shown in FIG. 5, at the transition of the potential at the output terminal 11E from the high potential to the low potential, only when the potential at the output terminal 11E decreases below the threshold of the inverter 21, does a large current flow from the output terminal 11E to speed up the operation and to reduce entire power consumption. The value of the current flowing from the output terminal 11E when the terminal 11E changes from the high potential to the low potential can be freely selected by changing the size of the NMOSFET 22.

Figure 6A:
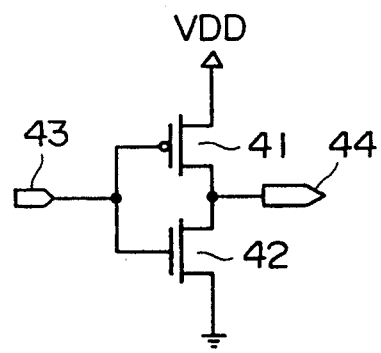
FIGS. 6(a) and 6(b) shows inverters used for the second embodiment shown in FIG. 5.
Figure 6B:
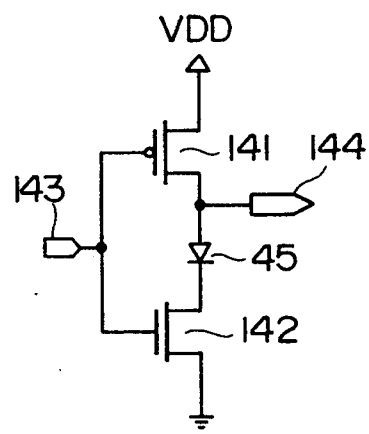

A circuit configuration, such as shown in FIG. 6(a) or 6(b), may be used for the inverter 21 of FIG. 5. In FIG. 6(a), the source-drain conduction paths of a PMOSFET 41 and an NMOSFET 42 are connected in series between the voltage supply VDD and ground, the junction between the two conduction paths being connected to an output terminal 44. The gates of the NMOSFET 42 and the PMOSFET 41 are connected to an input terminal 43. The output terminal 44 is connected to the gate of the NMOSFET 22, and the input terminal 43 is connected to the output terminal 11E of the circuit of FIG. 5. When the input terminal 43 is at the low potential, the PMOSFET 41 is conductive, which places the output terminal 44 at the high potential. On the other hand, when the input terminal 43 is at the high potential, the NMOSFET 42 conducts to place the output terminal 44 at the low potential.

Referring to FIG. 6(b), an inverter comprises a PMOSFET 141, an NMOSFET 142 and a diode 45 connected between the drain of the transistor 141 and the drain of the transistor 142. When an input terminal 143 is at the high potential, the diode 45 as well as the NMOSFET 142 is conductive. Then, the potential at the output terminal 11E is higher by 0.8 V, which is the forward potential difference of the diode 45, than the potential at the output terminal 11E under the same condition when the inverter of FIG. 6(a) is used instead, so that the change from the low to high potential of an output terminal 144 is accelerated. Thus, when the output terminal 11E changes from the high potential to the low potential in the circuit of FIG. 5, the amount of change is less by 0.8 V than the amount of change with the inverter of FIG. 6(a) used. Consequently, the NMOSFET 22 can be operated at a high speed. When the inverter of FIG. 6(b) is used in the current supply 20 of FIG. 5, the current supply 19 may be omitted. As stated above, the output potential of the inverter of FIG. 6(b) is always above 0.8 V and, therefore, the gate potential of the NMOSFET 22 of FIG. 5 is always above 0.8 V. Accordingly, a small current (subthreshold current) flows through the NMOSFET 22, so that when the base current is supplied to the bipolar transistor 15, 16, 17 or 18 from the inverter 11, 12, 13 or 14, the bipolar transistors can be rendered conductive.

Embodiment 3

Figure 7:
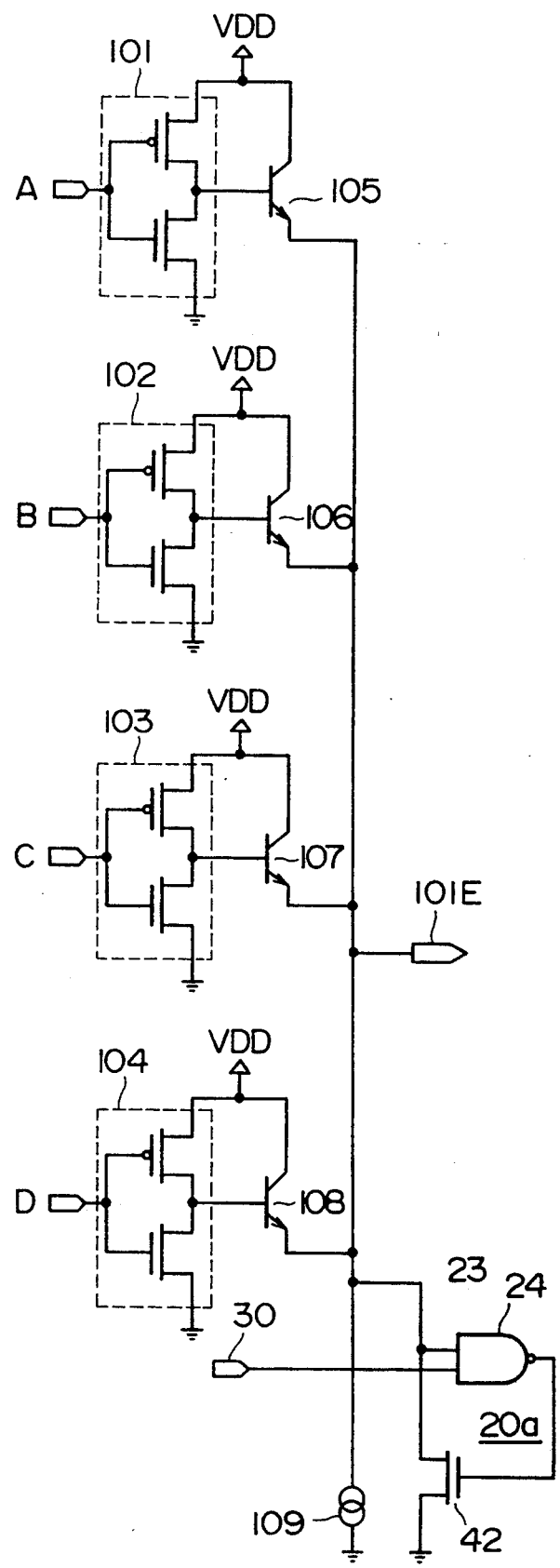
FIG. 7 shows a circuit arrangement according to a third embodiment of the present invention.

The circuit shown in FIG. 7 is similar to the circuit shown in FIG. 5, except that a current supply 20a employs a two-input NAND circuit 24 in place of the inverter 21 of the current supply 20 of FIG. 5. Components similar to those of the circuit of FIG. 5 are denoted by reference numerals used in FIG. 5 plus "100", and they are not described any more. One input 28 to the two-input NAND circuit 24 is connected to an output terminal 101E, while the other input 30 of the NAND circuit 24 may be led out of the four-input NAND circuit of FIG. 7 and supplied with a high or low potential control signal.

If the parasitic capacitance at the output terminal 101E is large, the input terminal 30 is fixed to the low potential, which causes the NAND circuit 24 to develop a high output potential so that the gate potential of the NMOSFET 42 can be fixed to the high potential. In this condition, by the time when the output potential starts falling, charge at the output terminal 101E has been drawn through both of the current supply 109 and the NMOSFET 42 so that the falling of the potential can be done at a high speed.

On the other hand, if the parasitic capacitance is not large, the input terminal 30 is fixed to the high potential. In this case, the NAND circuit 24 functions as an inverter. Thus, similar to the circuit shown in FIG. 5, when the potential at the output terminal 101E falls below the threshold value of the NAND circuit 24, the current supply 20a operates. Thus, the four-input NAND circuit of FIG. 7 can be adapted for both small parasitic capacitance and large parasitic capacitance at the output terminal 101E.

Embodiment 4

Figure 9:
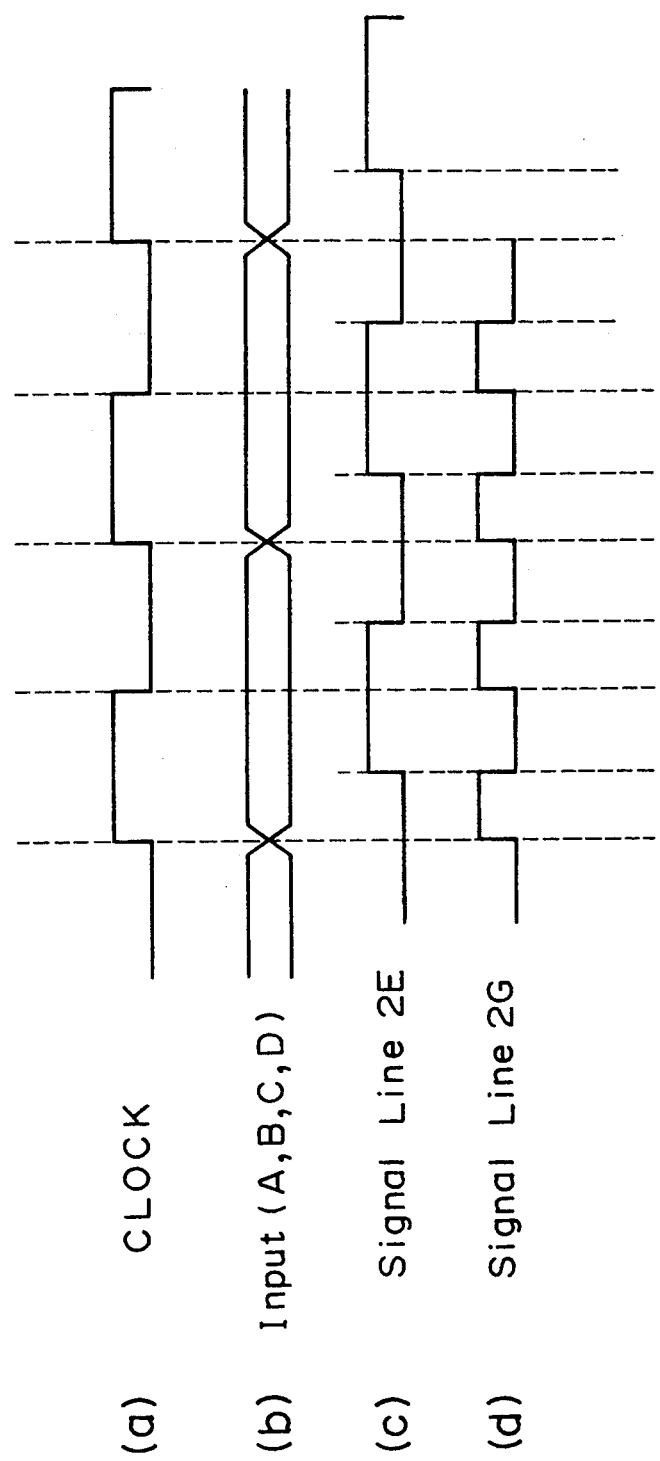
FIG. 9 is a timing diagram useful in explaining the operation of the circuit shown in FIG. 8.

FIG. 8 shows a four-input NAND circuit according to a fourth embodiment of the present invention. This circuit is arranged such that input signals A, B, C and D applied to inverters 31, 32, 33 and 34, which correspond to the inverters 1, 2, 3 and 4 of FIG. 3, respectively, changes to a high or low potential in synchronization with rising of a clock signal supplied from an external clock signal generator 26 (see FIGS. 9(a)–9(d)). With this arrangement, the potential at the output terminal 31E can change only within a time period from a rising of the clock signal, and, therefore, a large current is supplied to the output terminal 31E only during this time period. For this purpose, the clock signal 27 (see FIG. 9(a)) is imparted with a given time delay by inverters 28 and 29, and the thus delayed clock signal 2E (FIG. 9(c)) and the undelayed clock signal 27 are exclusive-OR processed in an exclusive-OR circuit 2F, of which the output 2G (FIG. 9(d)), in turn, is coupled to the gate of an NMOSFET 52. This output 2G is placed at the high potential only within a limited time period from each rising or falling of a clock pulse. Thus, when the potential at the output terminal 31E may change, i.e. when the clock signal rises, the NMOSFET 52 is rendered conductive to thereby cause a large current to flow only from the output terminal 31E. At a rising of the clock signal 27, there is not only a possibility that all of bipolar transistors 35, 36, 37 and 38 are non-conductive and the output terminal 31 is discharged, but also a possibility that one of the bipolar transistors 35–38 is conductive to charge the output terminal 31E. In order to deal with this latter case, the value of current which the NMOSFET 52 conducts is selected to be such a value as to maintain the output terminal 31E at the high potential even when the NMOSFET 52 conducts current from the output terminal 31E. Furthermore, at the falling edge of the clock signal 27, the NMOSFET 52 becomes conductive, too, to cause current to flow from the output terminal 31E. However, by that time, the input signals A, B, C and D have already completed transitions, and the output terminal 31E has been fully charged. Accordingly, when the NMOSFET 52 conducts, substantially no change occurs in the potential at the output terminal 31E. A current supply 39 is disposed to maintain the conduction of one or more of the bipolar transistors 35, 36, 37 and 38 which should be made conductive in accordance with the values of the input signals A, B, C and D, even when the control signal 2G is at the low potential. The time period during which a large current is to be supplied can be adjusted by adjusting the sizes of the transistors of the inverters 28 and 29. The current supply 39 is similar to the current supply 9 of the first embodiment.

Embodiment 5

Figure 10:
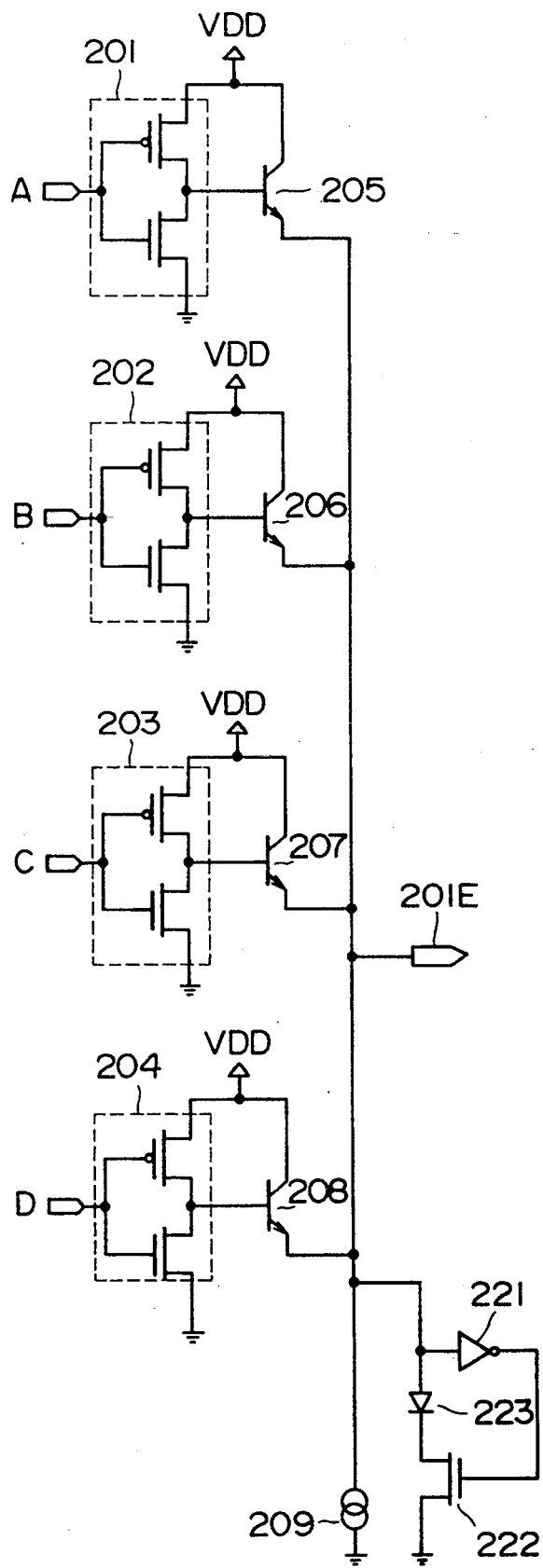
FIG. 10 shows a circuit arrangement according to a fifth embodiment of the present invention.

FIG. 10 shows a logic circuit according to a fifth embodiment of the invention. The circuit arrangement of FIG. 10 is substantially the same as that of FIG. 5. A diode 223 is connected between the output terminal 201E and the drain of an NMOSFET 222 (corresponding to NMOSFET 22 of FIG. 5). Due to the presence of this diode 223, the potential at the output terminal 201E, after charge has been drawn from it, is higher than the corresponding potential present at the output terminal 11E of the circuit of FIG. 5 after charge has been removed, by an amount of a forward potential difference of the diode 223 which is equal to about 0.8 V. Accordingly, the logic amplitude at the output terminal 201E (i.e. the difference between the potential at the output terminal 201 when it has been charged and the potential at the terminal 201E when it has been withdrawn) can be correspondingly smaller, which, in turn, results in a shorter time for charging or discharging the parasitic capacitance at the output terminal 201E. Thus the circuit can operate at a higher speed.

Embodiment 6

Figure 11:
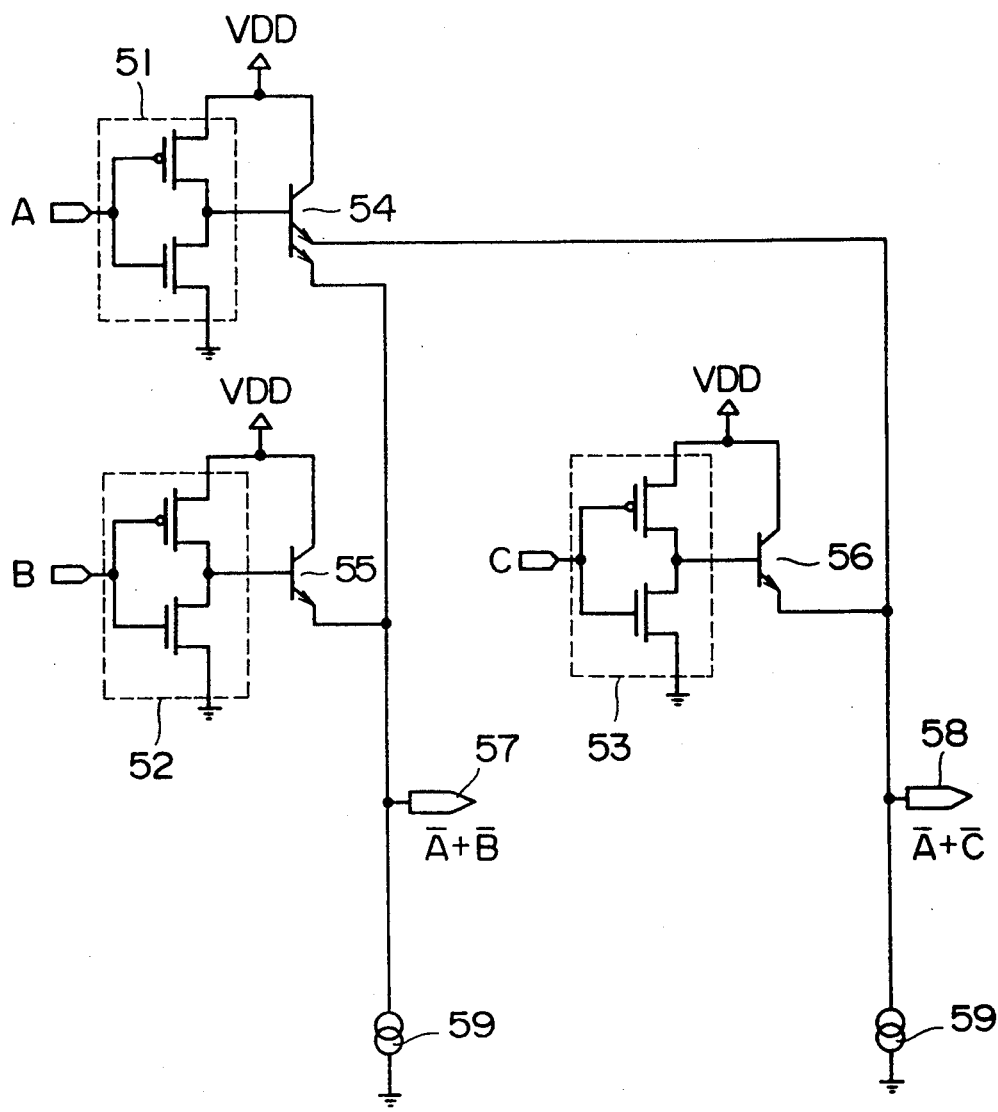
FIG. 11 shows a circuit arrangement according to a sixth embodiment of the present invention.

A logic circuit according to a sixth embodiment of the invention is shown in FIG. 11. The circuit can efficiently perform a plurality of logic functions, such as $\overline{A}+\overline{B}$ and $\overline{A}+\overline{C}$, which include a common term, A in this case. For this purpose, a bipolar transistor 54 which is used to provide an inverted version $\overline{A}$ of the input signal A is of a multiple-emitter type. An output terminal 57 is connected to one of the emitters of the bipolar transistor 54 and to the emitter of a bipolar transistor 55 which provides an inverted version $\overline{B}$ of the input signal B. A logic $\overline{A}+\overline{B}$ is developed at the output terminal 57. Similarly, an output terminal 58 is connected to another one of the emitters of the bipolar transistor 54 and to the emitter of a bipolar transistor 56 which provides an inverted version $\overline{C}$ of the input signal C, and a logic $\overline{A}+\overline{C}$ is produced at the output terminal 58.

Needless to say, as shown, the bases of the bipolar transistors 54, 55 and 56 receive the input signals A, B and C, respectively, which have been inverted by inverters 51, 52 and 53. The collectors of the bipolar transistors 54–56 are connected to a voltage supply VDD. Current supplies 59 connected between the output terminals 57 and 58 and ground, respectively, are of the same configuration as that of the current supply 9 of the first embodiment shown in FIG. 3.

Like this, a plurality of logic functions with a common term can be provided by using, for the common term, one inverter and a multiple-emitter bipolar transistor having a number of emitters which is equal to the number of the total number of terms to be dealt with minus one. Thus, the number of components can be reduced.

Embodiment 7

Figure 12A:
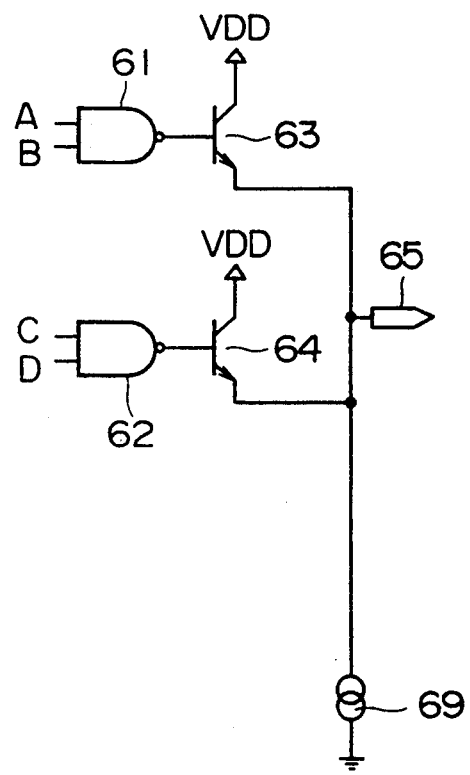
FIG. 12a shows a circuit arrangement according to a seventh embodiment of the present invention.
Figure 12B:
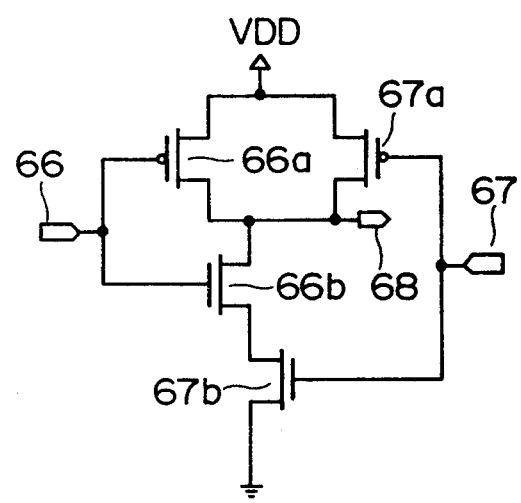

In FIG. 3, a circuit arrangement for providing OR-processing of inverted versions of input signals is shown. However, the present invention is not limited to such a circuit, but is applicable to a circuit which produces more complicated logic functions. A logic circuit according to a seventh embodiment of the present invention is shown in FIG. 12. This circuit provides a logic sum of outputs of two two-input NAND circuits 61 and 62 by means of bipolar transistors 63 and 64. More specifically, the outputs of the NAND circuits 61 and 62 are applied to the bases of the bipolar transistors 63 and 64, respectively, which have their collectors coupled to a voltage supply VDD, and have their emitters coupled together to an output terminal 65. A current supply 69 similar to the current supply 9 of the first embodiment is connected between the output terminal 65 and ground. The logic provided at the output terminal 65 is $\overline{(A \cdot B)}+\overline{(C \cdot D)}=\overline{A}+\overline{B}+\overline{C}+\overline{D}$. For each of the two-input NAND circuits 61 and 62, a circuit such as shown, for example, in FIG. 12(b) may be used. The two-input NAND circuit shown in FIG. 12(b) includes PMOSFET's 66a and 67a which have their source-drain conduction paths connected in parallel with each other between a voltage supply VDD and an output terminal 68, and NMOSFET's 66b and 67b having their source-drain conduction paths connected in series between the output terminal 68 and ground. An input terminal 66 is connected to the gates of the PMOSFET 66a and the NMOSFET 66b, and another input terminal 67 is connected to the gates of the PMOSFET 67a and the NMOSFET 67b. Thus, when at least one of the input terminals 66 and 67 is at a low potential, corresponding one of the the PMOSFET's 66a and 67a becomes conductive so as to place the output terminal 68 at a high potential. If both of the input terminals 66 and 67 are at the high potential, the NMOSFET's 66b and 67b are both rendered conductive so that the output terminal 68 assumes the low potential.

Embodiment 8

Figure 13A:
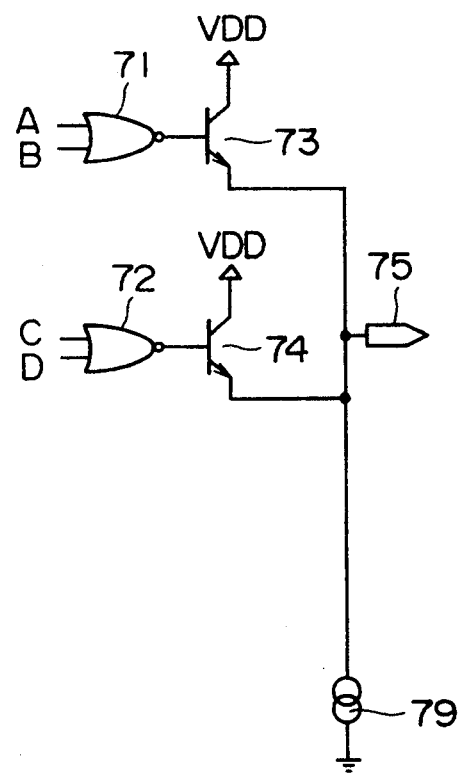
FIG. 13a shows a circuit arrangement according to an eighth embodiment of the present invention.
Figure 13B:
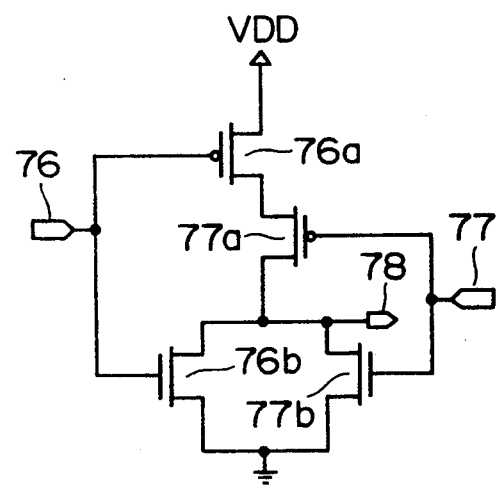

FIG. 13 shows a circuit according to an eighth embodiment of the present invention. The circuit arrangement shown in FIG. 13(a) provides a logic sum of outputs of two two-input NOR circuits 71 and 72 by means of bipolar transistors 73 and 74. More specifically, the outputs of the NOR circuits 71 and 72 are applied to the bases of the transistors 73 and 74, respectively, which have their collectors connected to a voltage supply VDD and have their emitters connected together to an output terminal 75. A current supply 79 similar in configuration to the current supply 9 of FIG. 3 is connected between the output terminal 75 and ground. The logic realized at the output terminal 75 is $\overline{(A+B)}+\overline{(C+D)}=\overline{A}\cdot\overline{B}+\overline{C}\cdot\overline{D}$. By using using $\overline{B}$ in place of B, $\overline{A}$ in place of C, and B in place of D, which are applied to the NOR circuits 71 and 72, the output is $A \cdot \overline{B} + \overline{A} \cdot B$. That is, an exclusive OR function is realized. For each of the two-input NOR circuits 71 and 72, a circuit arrangement such as shown in FIG. 13(b) may be used. The NOR circuit shown in FIG. 13(b) comprises PMOSFET's 76a and 77a having their source-drain conduction paths connected in series between the voltage supply VDD and an output terminal 78, and NMOSFET's 76b and 77b having their source-drain conduction paths connected in parallel between the output terminal 78 and ground. The gates of the PMOSFET 76a and the NMOSFET 76b are connected to an input terminal 76, while the gates of the PMOSFET 77a and the NMOSFET 77b are connected to another input terminal 77. Thus, when both of the input terminals 76 and 77 are at a low potential, both PMOSFET's 76a and 77a become conductive so that the output terminal 78 is placed at the high potential. When at least one of the input terminals 76 and 77 is at the high potential, a corresponding one of the NMOSFET's 76b and 77b becomes conductive so that the output terminal 78 is placed at the low potential.

Various logics may be realized by various combinations of different CMOS logic circuits other than those shown in FIGS. 12 and 13. The circuits shown in FIGS. 11, 12 and 13 have been described as employing the current supply shown in FIG. 4, but the operating principle is the same if the current supply shown in any one of FIGS. 5, 7, 8 and 10.

What is claimed is:

1. A semiconductor logic circuit apparatus comprising:
   logic circuits, each having active elements consisting of complementary field effect transistors and having at least one input and a logic output;
   bipolar transistors, each having a base connected to said logic output of a corresponding one of said logic circuits, and each having their collectors connected to a voltage supply;
   a common node to which emitters of said bipolar transistors are connected;
   an output of said semiconductor logic circuit connected to said common node; and
   an active current supply means, connected between said common node and a point of ground potential, for directing current at a level non-linearly responsive to an output level at said common node.

2. A semiconductor logic circuit apparatus according to claim 1 wherein said current supply comprises a plurality of current supply means connected in parallel with each other.

3. A semiconductor logic circuit apparatus according to claim 1 wherein said logic circuits are inverters.

4. A semiconductor logic circuit apparatus according to claim 1 wherein said logic circuits are NAND circuits.

5. A semiconductor logic circuit apparatus according to claim 1 wherein said logic circuits are NOR circuits.

6. The logic circuit according to claim 1 wherein said current supply means includes control means, responsive to an output potential at said output node, for varying a current level passing through said current supply means.

7. A semiconductor logic circuit apparatus comprising:
logic circuits including complementary field effect transistors:
bipolar transistors having bases connected to outputs of said respective logic circuits, and having collectors connected to a voltage supply;
a common node having emitters of said bipolar transistors connected thereto;
a current supply connected between said common node and a point of ground potential;
said current supply including first and second current supply means for current sinking connected in parallel;
said first current supply means operating normally;
said second current supply means including means for initiating operation of said second current supply means only when a potential at said common node decreases from a high potential to a predetermined level.

8. A semiconductor logic circuit apparatus according to claim 7 wherein said initiating means is an inverter.

9. A semiconductor logic circuit apparatus according to claim 7 wherein
said second current supply means includes means for switching said second current supply means between a state in which said second current supply means normally operates, and a state in which said second current supply means is is controlled by said means for initiating.

10. A semiconductor logic circuit apparatus comprising:
logic circuits including complementary field effect transistors;
bipolar transistors having bases connected to outputs of said respective logic circuits, and having collectors connected to a voltage supply;
a common node having emitters of said bipolar transistors connected thereto;
a current supply connected between said common node and a point of ground potential;
said current supply including first and second means for current sinking connected in parallel;
said first means for current sinking normally operating;
said second means for current sinking including control means for operating said second means for current sinking in synchronization with a timing signal coincident with transitions of signals applied to said logic circuits; and
said control means including means for generating a pulse, in response to a change of state of said timing signal, to activate said second means for current sinking to sink current during appropriate transitions of an output signal at said common node.

11. A semiconductor logic circuit apparatus comprising:
a plurality of logic circuits, each comprising complementary field effect transistors;
a plurality of bipolar transistors having their bases connected to the outputs of said respective logic circuits and having their collectors connected a voltage supply;
a common node to which the emitters of said bipolar transistors are connected;
a current supply connected between said common node and a point of ground potential, said current supply operating when a control signal is applied thereto; and
inverter means having its input connected to said common node and having its output connected to supply said control signal to said current supply.

12. A semiconductor logic circuit apparatus according to claim 11 wherein said inverter means comprises:
a PMOSFET having its gate connected to said common node and having its drain connected to a higher potential point;
a diode having its anode connected to the source of said PMOSFET;
an NMOSFET having its gate connected to said common node, having its source connected to a lower potential point, and having its drain connected to the cathode of said diode; and
an output terminal connected to the junction between the source of said PMOSFET and the anode of said diode, and connected to said current supply.

13. A semiconductor logic circuit apparatus comprising:
a plurality of common nodes;
a plurality of current supplies connected between the respective ones of said common nodes and a point of lower potential;
a multiple-emitter bipolar transistor having its emitters connected to the respective ones of said common nodes, and having its collector connected to a point of higher potential;
a common logic circuit comprising complementary field effect transistors, having its output connected to the base of said multiple-emitter bipolar transistor;
a plurality of bipolar transistors having their emitters connected to the respective ones of said common nodes, and having their collectors connected to said point of higher potential; and
a plurality of logic circuits having their outputs connected to the bases of the respective ones of said plurality of bipolar transistors.

14. A semiconductor logic circuit apparatus according to claim 13 wherein said common logic circuit and said plurality of logic circuits each comprises an inverter.

15. A logic circuit, comprising:
a drive circuit having at least one input;
said drive circuit having an output circuit for one of sourcing and sinking currents from an output node in response to said at least one input;
first current directing means for another one of sourcing and sinking current from said output node:

said first current directing means being normally operative;

second current directing means for said another one of sourcing and sinking current from said output node;

said second current directing means including control means for operating said second current directing means only during transitions of a signal at said output node wherein said second means enhances a transition time of said signal;

said control means including a switch means, responsive to a predetermined output level at said output node, for operating said second current directing means; and said control means including means for generating a pulse in response to a change of state of a timing signal, coincident with transition of signals applied to said at least one input, to activate said second means for sinking current to sink current during appropriate transitions of an output signal at said common node.

16. The logic circuit according to claim 15 wherein said means for generating a pulse includes:

delay means for delaying said timing signal to output a delayed signal; and a logic gate means, accepting said timing signal and said delayed signal, for producing said pulse in response to a predetermined combination of states of said delayed signal and said timing signal occurring substantially at a transition time of said signals applied to said at least one input.

* * * * *